United States Patent
Tabuchi et al.

[11] Patent Number: 5,255,276
[45] Date of Patent: Oct. 19, 1993

[54] DRIVER CIRCUIT OF A TUNABLE LASER DIODE

[75] Inventors: Haruhiko Tabuchi; Shouichi Ogita; Yuji Kotaki, all of Kawasaki, Japan

[73] Assignee: Fujitsu Limited, Kawasaki, Japan

[21] Appl. No.: 800,936

[22] Filed: Dec. 2, 1991

[30] Foreign Application Priority Data

Nov. 30, 1990 [JP] Japan ................. 2-329707

[51] Int. Cl.$^5$ ............................................. H01S 3/10
[52] U.S. Cl. ........................................ 372/32; 372/28; 372/31
[58] Field of Search ............... 372/29, 31, 32, 38, 372/26, 28, 20

[56] References Cited

U.S. PATENT DOCUMENTS 4,932,034  6/1990  Usami et al. ..................... 372/96

*Primary Examiner*—James W. Davie
*Attorney, Agent, or Firm*—Staas & Halsey

[57] ABSTRACT

A driver circuit of a laser diode. The laser diode has a first electrode structure for injecting a first drive current with a first magnitude and a second electrode structure separated from the first electrode structure for injecting a second drive current with a second magnitude. The second electrode structure is provided in correspondence to a location in said diode at which carriers are depleated most. The driver circuit comprises a presetting circuit for presetting a relationship between the first and second magnitudes, and a current distribution circuit controlled by the presetting circuit for producing the first and second drive currents with respective magnitude satisfying the relationship that is preset by the presetting means.

11 Claims, 18 Drawing Sheets

$Ic_1 < Ic_2 < Ic_3 < Ic_4 < Ic_5$ $V_O = RI_p$

DRIVER CIRCUIT OF A TUNABLE LASER DIODE

BACKGROUND OF THE INVENTION

The present invention generally relates to semiconductors and more particularly to a driver circuit of a tunable laser diode.

The inventors of the present application have proposed previously in the U.S. patent application Ser. No. 552,116, now abandoned for Ser. No. 789,427, now U.S. Pat. No. 5,170,402 and in the corresponding European patent application No. 90307626.3, a tunable laser diode that has a DFB corrugation and includes a plurality of electrodes separated from each other electrically and provided in tandem along the resonant structure. The foregoing references are incorporated herein by reference.

In this laser diode, a non-uniform distribution of photons, and hence of carriers, is induced in the resonant structure such that the carrier density becomes a minimum in correspondence to a central part of the structure. A first electrode is provided in correspondence to such minimum of the carrier density. It should be noted that the minimum of the carrier density corresponds to the maximum of the photon density. Further, in correspondence to the maximum of the carrier density occurring at the opposite ends of the laser diode, second and third electrodes are provided. The first electrode injects a first drive current while the second and third electrodes inject a second drive current, wherein the first drive current is set substantially smaller than said second drive current thereby to cause the desired non-uniform distribution of the carriers. Further, a modulation signal is superposed on the first drive current. By supplying the modulation signal to the region where the carriers are depleted, a large shift of the oscillation wavelength is achieved in response to the modulation signal.

FIG. 1 shows the foregoing tunable laser diode wherein the laser diode includes an n-type InP substrate 1 on which a waveguide layer 2 of n-type GaInAsP is provided. On the waveguide layer 2, there is provided an active layer 3 of undoped GaInAsP and a clad layer 4 of p-type InP is provided on the active layer 3. Thus, the diode has a double-hetero p-n junction and a corrugated grating is formed at an interface between the substrate 1 and the waveguide layer 2. On the clad layer 4, an electrode 17 is provided in correspondence to a central longitudinal part, or portion of the structure as the first electrode, and respective electrodes 16 and 18 are provided at the opposite sides thereof, in the longitudinal direction, with a separation therebetween.

In order to induce the non-uniform distribution of the carriers and to cause the non-uniform distribution of the photons in the laser diode, a drive current Is is supplied to the electrodes 16 and 18 together with a drive current Ic that is supplied simultaneously to the electrode 17. By setting the magnitude of the currents Is and Ic suitably, the desired distribution of the carriers is obtained.

FIG. 2 shows another example of the conventional tunable laser diode, wherein a number of electrodes 10-15 are provided on the upper major surface of the clad layer 4.

In this laser diode, too, a non-uniform distribution of the carriers is induced in the laser diode along the longitudinal direction, wherein the electrodes 12 and 13 at the center are provided in correspondence to the minimum of the carrier density and the current Ic is supplied thereto, similarly to the device of FIG. L. On the other hand, other electrodes 10-11 and 14-15 are supplied with the current Is.

FIG. 2 also shows the cross section of the laser diode. As shown therein, the essential part of the laser diode, such as the upper part of the substrate 1, on which the corrugation grating is formed, the active layer 3, and the clad layer 4, forms a stripe region or mesa structure 8 extending in the longitudinal direction, and both of the opposite sides of the mesa structure 8 are filled by a p-type buried layers 5 and 6 of InP. Further, a common electrode 9 is provided on the bottom surface of the substrate 1.

FIG. 3 shows another example of the conventional laser diode, wherein the laser diode is formed from three segmented parts 21, 22 and 23 that are arranged to share a common optical axis 24. The parts 21-23 carry thereon electrodes 21a-23a. In this structure, too, the non-uniform distribution of the carriers is induced in the array of the parts 21-23, by supplying the drive current Is to the electrodes 21a and 23a while supplying the drive current Ic to the electrode 21b.

It should be noted that the foregoing laser diodes are characterized by a frequency modulation operation wherein the oscillation frequency changes in response to the current injected to the electrodes, e.g., 16-18 in FIG. 1. In the frequency modulation operation of the laser diode, there exist three independent parameters, i.e. the oscillation frequency, the output power and the modulation efficiency, wherein the modulation efficiency eff is defined as a frequency shift $\Delta f$ divided by a current variation $\Delta IC$ that has caused the frequency shift $\Delta f$ (eff = $\Delta f/\Delta Ic$).

FIG. 4 shows the relationship between the oscillation wavelength $\lambda$ and the injection current Is for various values of the injection current Ic. As shown in FIG. 4, the oscillation wavelength $\lambda$ changes in response to both the current Ic and the current Is, wherein the line designated as M indicates the operational point on which the modulation efficiency eff is held constant. Along the line M, one can control the oscillation wavelength of the laser diode while maintaining the modulation efficiency eff constant. It should be noted that, when the current Ic is changed while holding the current Is constant, both the output power and the modulation efficiency change in response to the current Ic. This reflects the situation that there are three independent parameters (oscillation wavelength, output power and the modulation efficiency) of laser operation while there are only two variables, Ic and Is, that are controlled by the external drive circuit. The remaining independent parameter of the laser oscillation is the temperature of operation. In the foregoing description, it is assumed that the temperature of the laser is held constant during the operation.

FIG. 5 shows the relationship between the output power and the current Is for various values of the current Ic. As will be noted, the output power changes when the current Ic is changed while holding the current Is constant. In FIG. 5, the line designated by N indicates the line along which one can change the output power while holding the modulation efficiency constant. Again, it is assumed that the temperature of the laser is held constant.

FIG. 6 shows the relationship between the modulation efficiency eff and the current Is for various values of the current Ic. As can be seen in FIG. 6, the value of the modulation efficiency changes generally with the current Ic and the current Is. For example, the modulation efficiency changes between Δf1 and Δf2 when the current Ic is changed from Ic4 to Ic5 while holding the value of the current Is at Is1. On the other hand, the modulation efficiency eff is held constant on a line designated P when the current Ic and the current Is are changed simultaneously with a predetermined relationship.

SUMMARY OF THE INVENTION

Accordingly, it is a general object of the present invention to provide a novel and useful driver circuit for driving a tunable laser diode wherein the foregoing problems are eliminated.

Another and more specific object of the present invention is to provide a driver circuit for driving a tunable laser diode such that there is induced a non-uniform profile of carrier concentration in the laser diode along an optical axis and for injecting modulation current in correspondence to a location where the carriers are most strongly depleted hereby to cause a frequency modulation in the optical beam produced by the laser diode, said driver supplying a first drive current to the part of the laser diode where the carrier depletion is occurring and a second drive current to the part where the carrier density is large, with a ratio set such that either two of the oscillation wavelength, output optical power and the modulation efficiency are held constant during the modulation operation.

Another object of the present invention is to provide a driver circuit for driving a tunable laser diode having a first electrode provided in correspondence to a location where the carriers are strongly depleted and second electrodes provided at both longitudinal sides of the laser diode in correspondence to where the carriers are abundant, wherein the driver circuit includes: a preset means for specifying a relationship, in terms of the magnitude, of a first drive current supplied to the first electrode and a second drive current supplied to the second electrodes; and current distribution means controlled by said preset means for producing the first and second drive currents with the relationship determined by the preset means. According to the present invention, one can maintain any two of the oscillation wavelength, output optical power and the modulation efficiency constant. For example, one can maintain the optical power and the modulation efficiency substantially constant during the modulation of the laser diode. Alternatively, one can maintain the oscillation wavelength and the modulation efficiency substantially constant during the modulation of the laser diode. Thereby, a stable optical communication can be achieved for example in the optical fiber network such as a LAN or a network extending over a long distance.

It will be noted that the temperature of the laser diode changes during the operation. When such a temperature change occurs, the oscillation wavelength and output power of the laser diode change also. Further, it is known that the output power of the laser diode decreases after a prolonged use due to the increase of the defect density. In the laser diode for use in optical telecommunications, it is essential that the laser diode maintains the oscillation frequency or output power constant during the operation in addition to the modulation efficiency even when there is a temperature change or after prolonged use. Generally, the laser diodes for the optical telecommunication system is required to operate stably at least for thirty years. The present invention provides a laser diode that is suitable for this purpose.

Other objects and further features of the present invention will become apparent from the following detailed description when read in conjunction with the attached drawings.

DETAILED DESCRIPTION

Figure 7:
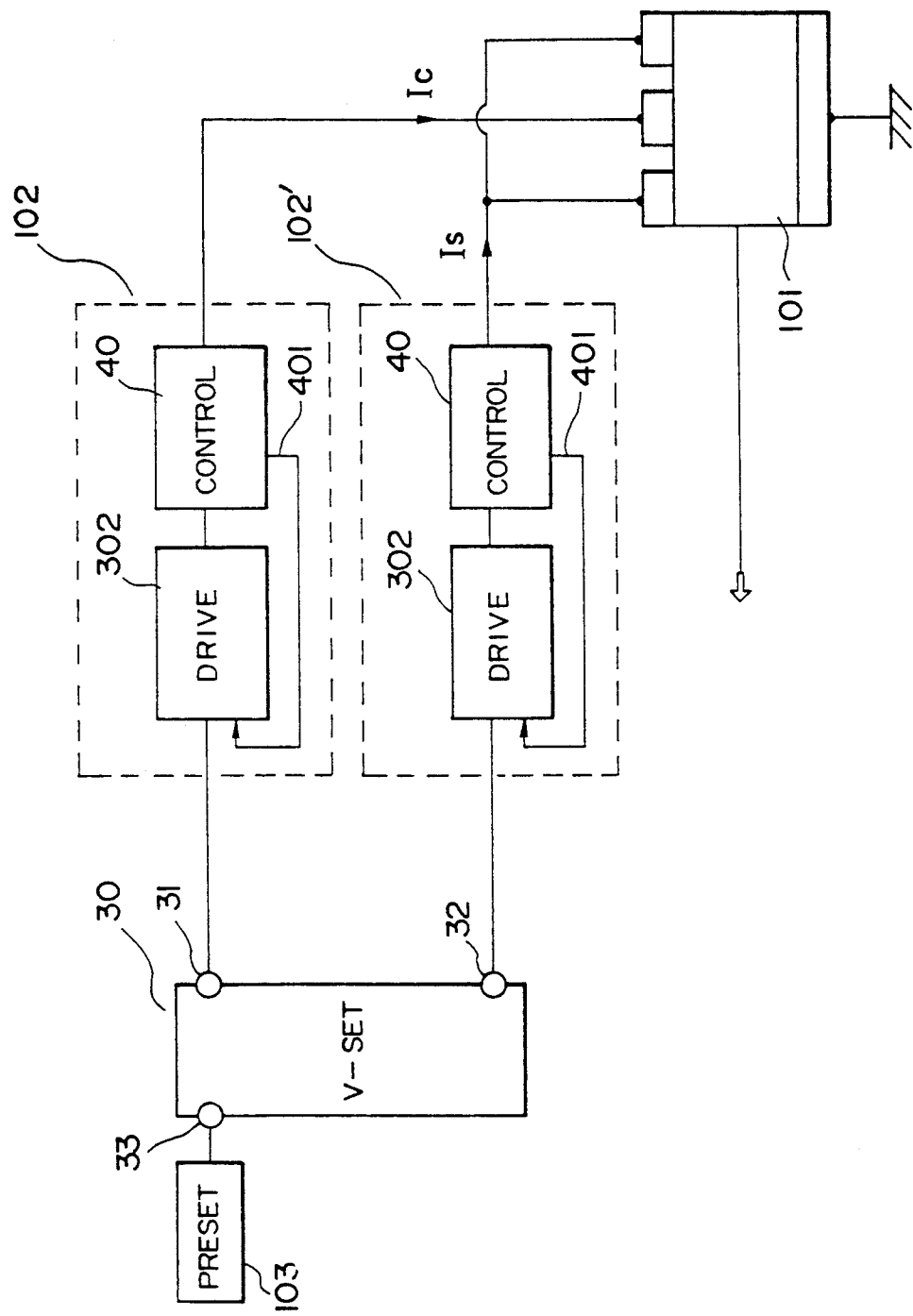
FIG. 7 is a block diagram of a first embodiment of the driver circuit according to the present invention.

FIG. 7 shows the block diagram of the driver circuit according to a first embodiment of the invention.

Referring to FIG. 7, there is provided a tunable laser diode 101 of which the construction and operation are explained already with reference to FIGS. 1–6, wherein the drive current Ic is controlled by a driver circuit 102 while the drive current Is is controlled by a driver circuit 102'. Further, in order to produce the currents Ic and Is with the desired ratio, a current distributor 30 is provided such that the distributor 30 produces the current Ic at an output port 31 and the current Is at another output port 32. In order to set the ratio of the current Ic and Is, a preset controller 103 is used to supply a control voltage to the distributor 30 via an input terminal 33. The current distributor 30 produces the current Ic and the current Is with a linear relationship such that the output voltage A at the port 31 and the output voltage B at the port 32 are represented as $$A = k \cdot B$$

where k is a constant determined by the preset controller 103.

Figure 8:
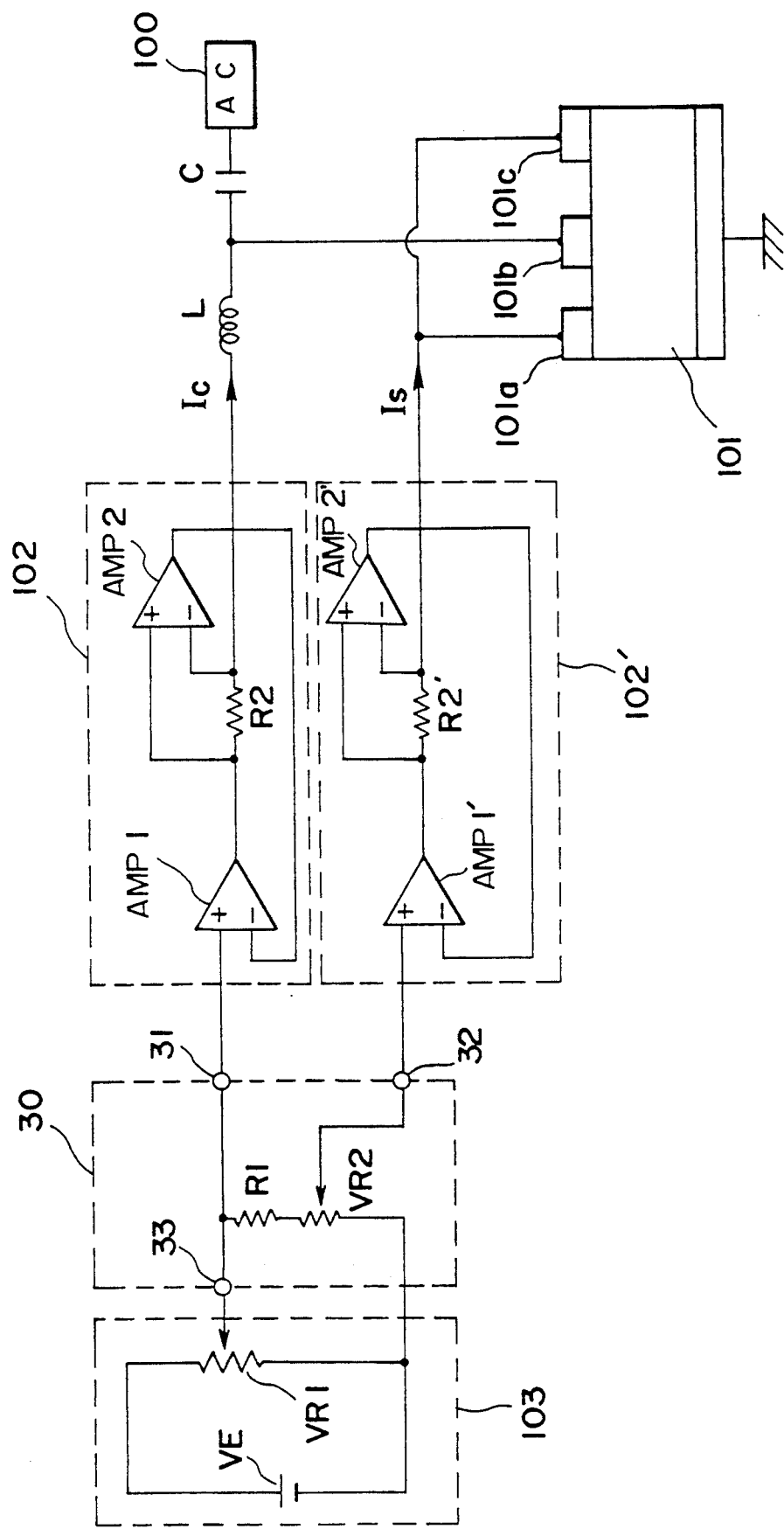
FIG. 8 is a circuit diagram corresponding to the block diagram of FIG. 7.

FIG. 8 shows the circuit diagram of the driver circuit of FIG. 7.

Referring to FIG. 8, the driver circuit includes a voltage source VE for producing a predetermined voltage and a potentiometer VR1 for dividing the voltage VE at a desired level.

The output voltage thus produced by the voltage divider VR1 is then supplied to the input port of the voltage distributor 30, wherein the voltage distributor 30 includes a resistor R1 and a potentiometer VR2 connected in series. In the voltage distributor 30, the voltage at the input port 33 is passed immediately to the output port 31 on the one hand, while a voltage obtained by voltage dividing by the potentiometer VR2 is sent to an output terminal 32 on the other hand.

The voltage at the output port 31 is supplied to the driver circuit 102, wherein the voltage is first supplied to the non-inverting input terminal of a differential amplifier AMP1 for amplification, and the output of the amplifier AMP1 is supplied to a central electrode 101b via a resistor R2. Further, the voltage appearing across the resistor R2 is detected by another differential amplifier AMP2 and the output of the amplifier AMP2 is supplied to the inverting input terminal of the amplifier AMP1. Thereby, any variation of the current Ic is suppressed by the feedback operation of the amplifiers AMP1 and AMP2, and the magnitude of the current Ic is held at the level corresponding to the ratio set by the controller 103.

Similar to the driver circuit 102, the driver circuit 102' includes a differential amplifier AMP1' corresponding to the amplifier AMP1', wherein the output of the amplifier AMP1' is detected by an amplifier AMP2' and controlled to a constant level by the feedback loop formed by the amplifiers AMP1' and AMP2'. The output of the amplifier AMP1' is supplied to electrodes 101a and 101c of the laser diode 101 as the current Is via a resistor R2' that corresponds to the resistor R2.

The current Ic is supplied to the electrode 101b of the laser diode 101 via an inductance L. In the laser diode 101, it should be noted that the electrode 102b is provided in correspondence to the location therein of the minimum of the carrier density while the electrode 101a and 101c are provided in correspondence to the locations therein of the maximum of the carrier density. Thereby, a modulation signal produced by an A.C. source 100 is superposed on the current Ic via a capacitor C and supplied selectively to the region of the laser diode 101 wherein the carriers are depleted the most.

Figure 1:
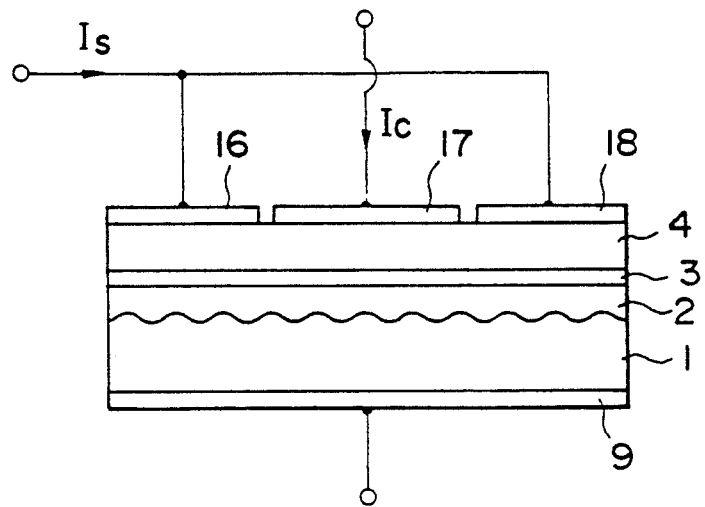
FIG. 1 is a diagram of a conventional tunable laser diode to which the driver circuit of the present invention is applied.
Figure 2:
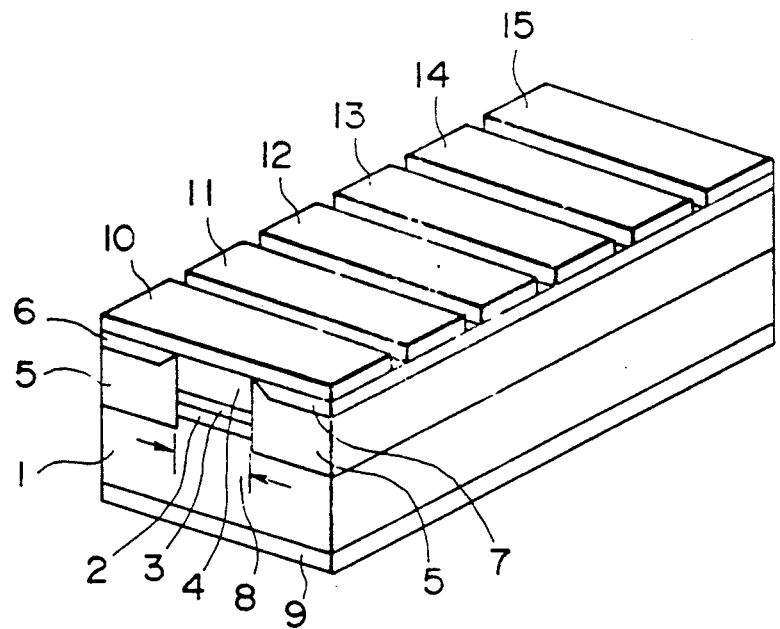
FIG. 2 is a diagram of another conventional tunable laser diode to which the driver circuit of the present invention is applied.
Figure 3:
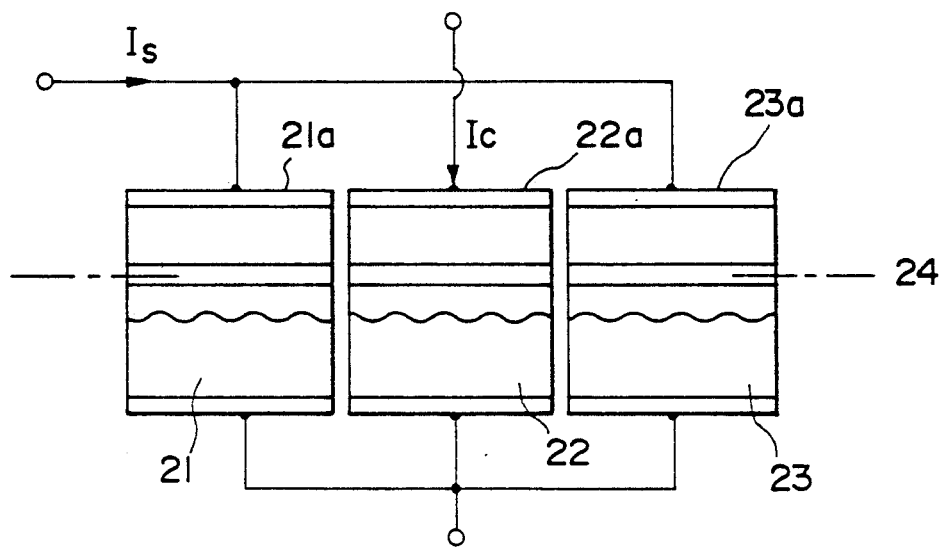
FIG. 3 is a diagram of still another conventional tunable laser diode to which the driver circuit of the present invention is applied.
Figure 4:
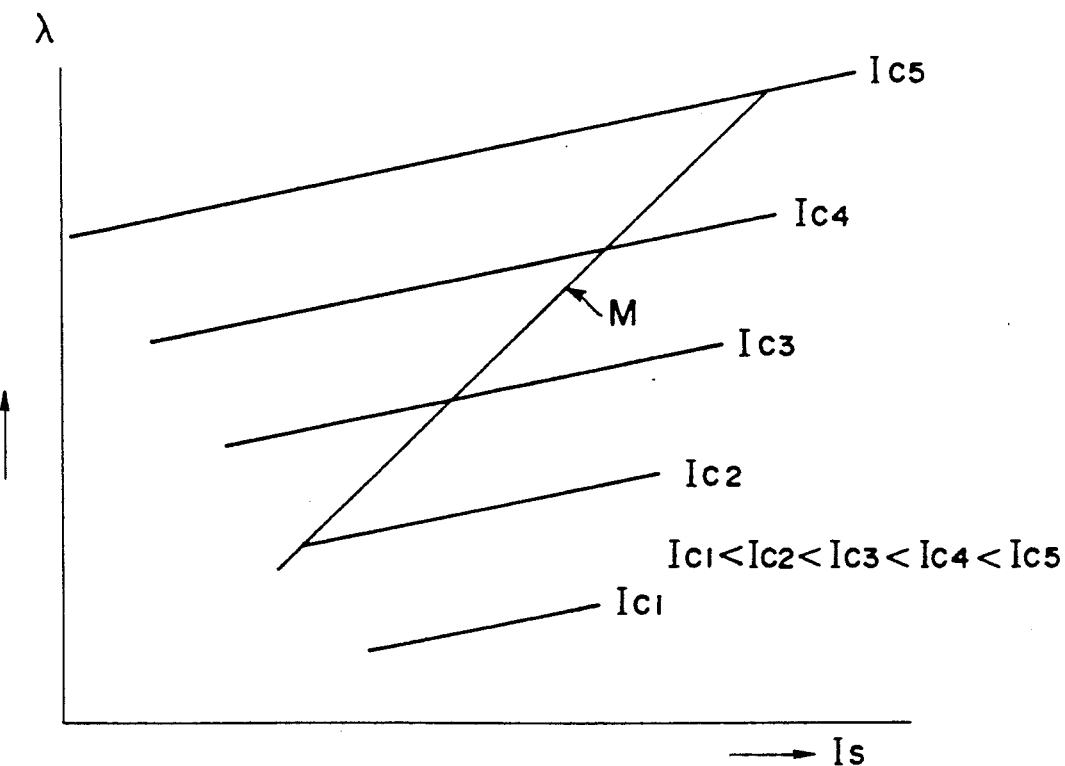
FIG. 4 is a graph showing the relationship between the oscillation wavelength of an injection current Is for various values of another injection current Ic, together with a line M that provides a constant optical output and a constant modulation efficiency.
Figure 5:
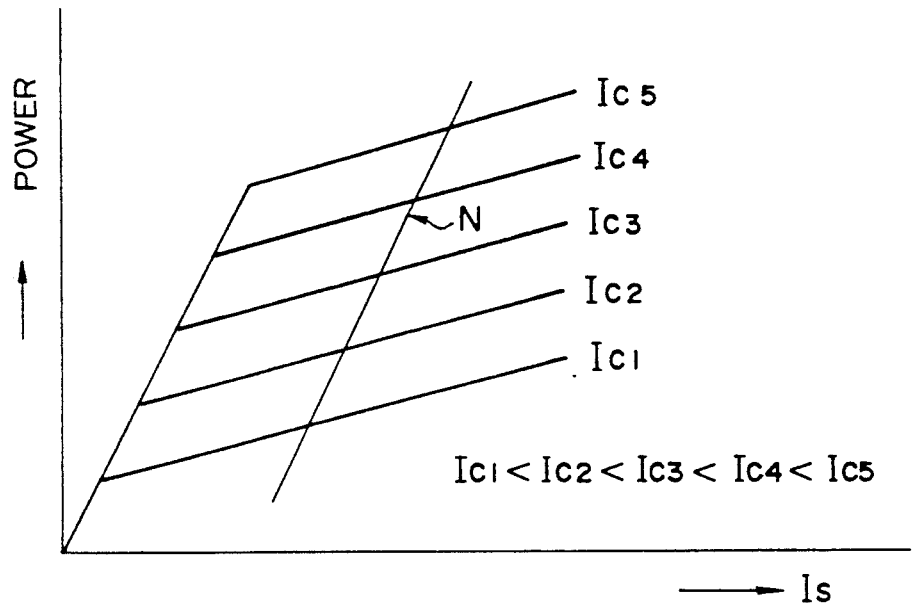
FIG. 5 is a graph showing the relationship between the optical output power and the injection current Is for various values of another injection current Ic, together with a line N that provides a constant oscillation wavelength and a constant modulation efficiency.
Figure 6:
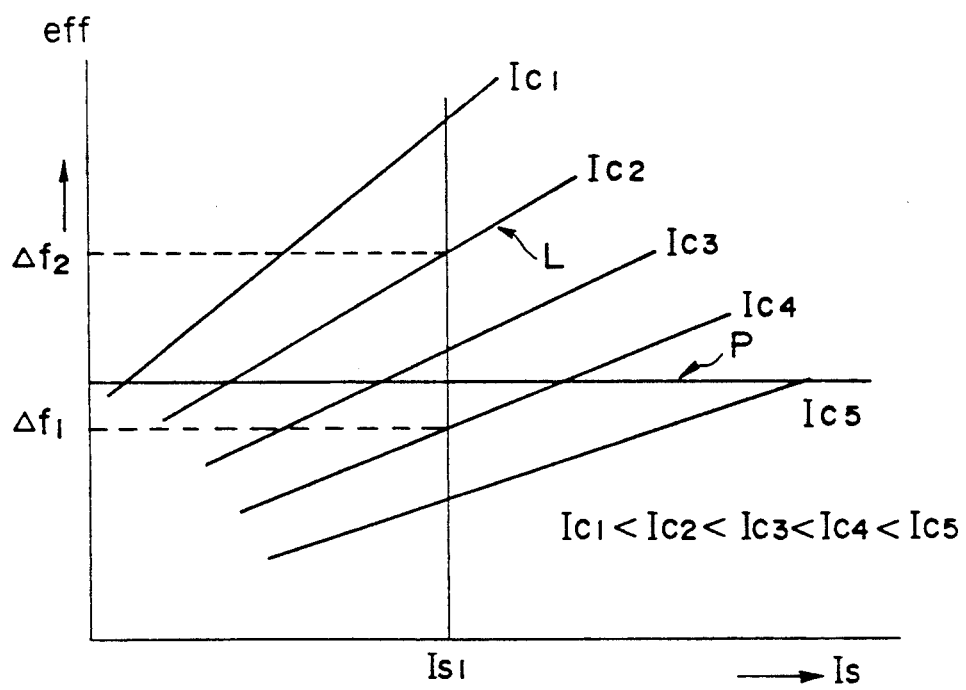
FIG. 6 is a graph showing the relationship between the modulation efficiency eff and the drive current Is for various values of the drive current Ic.

According to the construction of the driver circuit of FIGS. 7 and 8, the current Ic and the current Is are controlled as desired, and the desirable operation of the laser diode along the operational lines shown in FIGS. 4–6 is achieved. For example, one can maintain the modulation efficiency while controlling the output optical power as desired. Alternatively, one can maintain the modulation efficiency while controlling the oscillation wavelength as desired. Such a feature is particularly useful, hen using the tunable laser diode in optical telecommunication systems, for compensating the output power change or wavelength shift caused by the temperature variation while maintaining the modulation efficiency.

Figure 9:
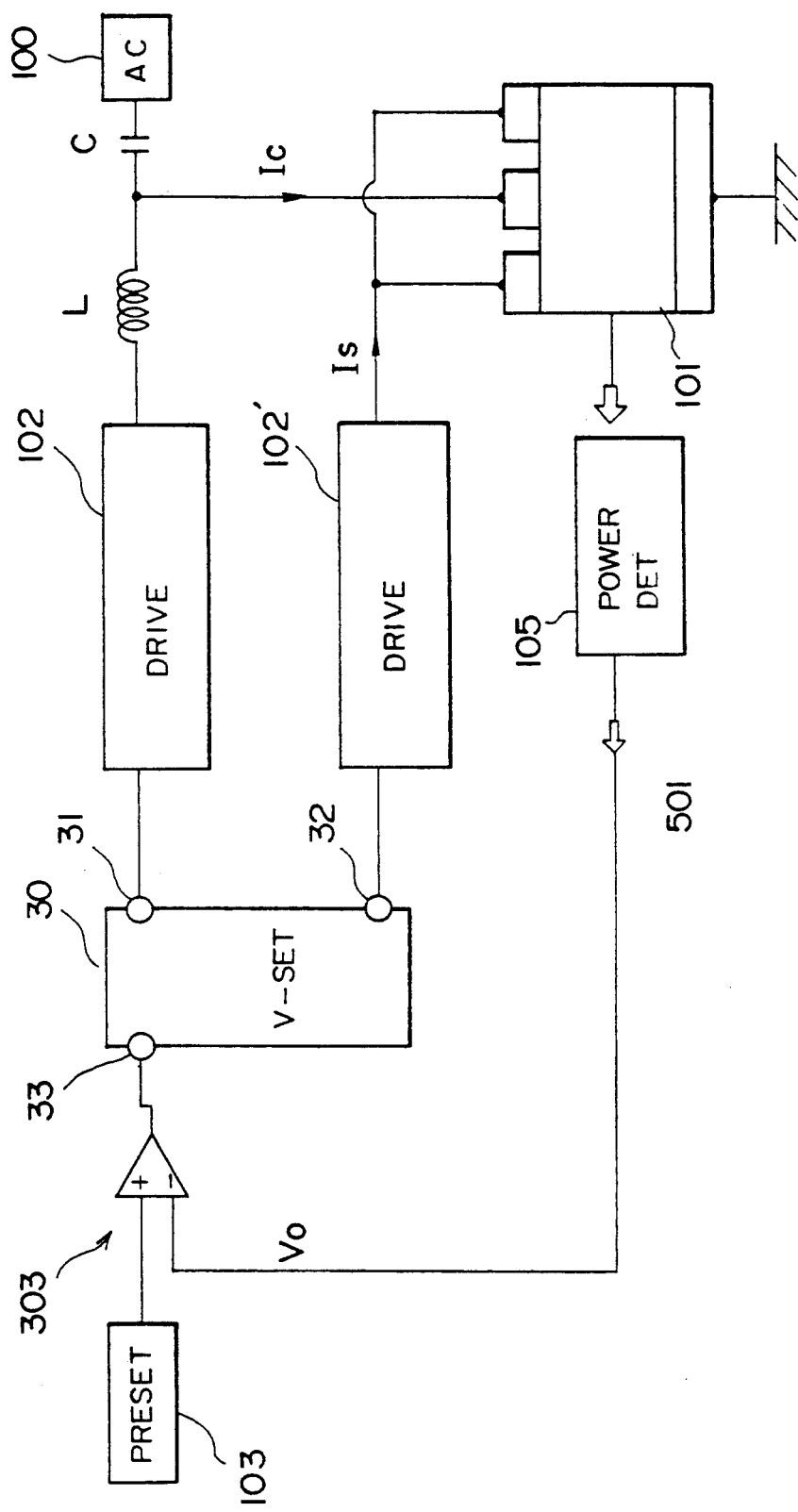
FIG. 9 is a block diagram of a second embodiment of the driver circuit according to the present invention.

FIG. 9 shows a second embodiment of the present invention, wherein the parts that are identical with those shown in the previous drawings are designated by the same reference numerals and the description thereof will be omitted.

In the present embodiment, an optical power detector 105 is provided for detecting the output optical power of the laser diode 101. The detector 105 produces an electrical signal indicative of the optical power of the laser beam produced by the laser diode 101, and the electrical signal is supplied to a comparator circuit 303 that is provided between the controller 103 and the input port 33 of the distributor 30. Thereby, a feedback circuit is formed by the optical detector 105, the comparator circuit 303, the voltage distributor 30 and the driver circuits 102, 102'.

Figure 10:
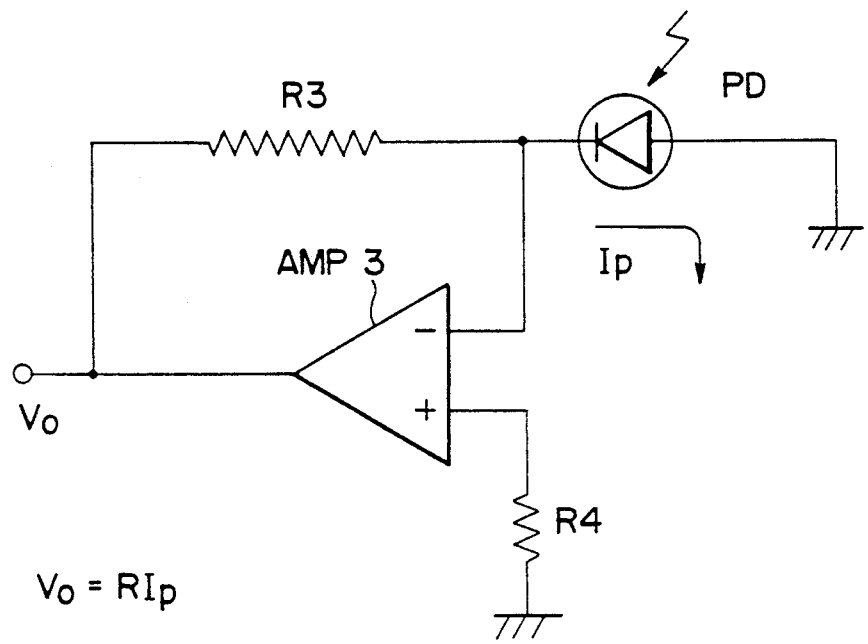
FIG. 10 is a circuit diagram of the of a power detector used in the embodiment of FIG. 9.

FIG. 10 shows the part of FIG. 9 which is added to the circuit shown in FIG. 7.

Referring to FIG. 10, a photodiode PD is used in the optical detector 105 for optical detection, wherein the photodiode PD is positioned to intersect the optical path of the laser diode and produces a current Ip in response to the optical output of the laser diode. The output current of the photodiode is amplified by an amplifier AMP3 that forms a linear amplifier circuit together with resistors R3 and R4 and is supplied to the comparator 303 as a control voltage Vo.

The comparator circuit 303 (FIG. 9) is supplied on the one hand with the output of the controller 103 at the non-inverting input terminal and with the output voltage Vo of the optical detector 105 at the inverting input terminal on the other hand, wherein the circuit 303 controls the output voltage level thereof, corresponding to the output voltage of the controller 103, in response to the output voltage Vo of the optical detector 105 such that the output optical power of the laser diode 101 is held substantially constant during the operation of the laser diode. Thereby, both the modulation efficiency and the output optical power of the laser diode 101 are held substantially constant. This feature is particularly advantageous for the frequency modulation of the laser diode 101. Similarly to the previous embodiment, the modulation signal 100 is superposed on the drive current Is supplied to the electrode 101b.

It should be noted that the feedback circuit including the amplifier AMP2 and the resistor R2 or the amplifier AMP2' and the resistor R2' may be eliminated in the driver circuits 102 and 102' in FIG. 9. This is because the feedback loop provided by the optical detector 105 provides the feedback operation that stabilizes the operation of the laser diode. See the description of FIG. 12(B) to be given later.

Figure 11A:
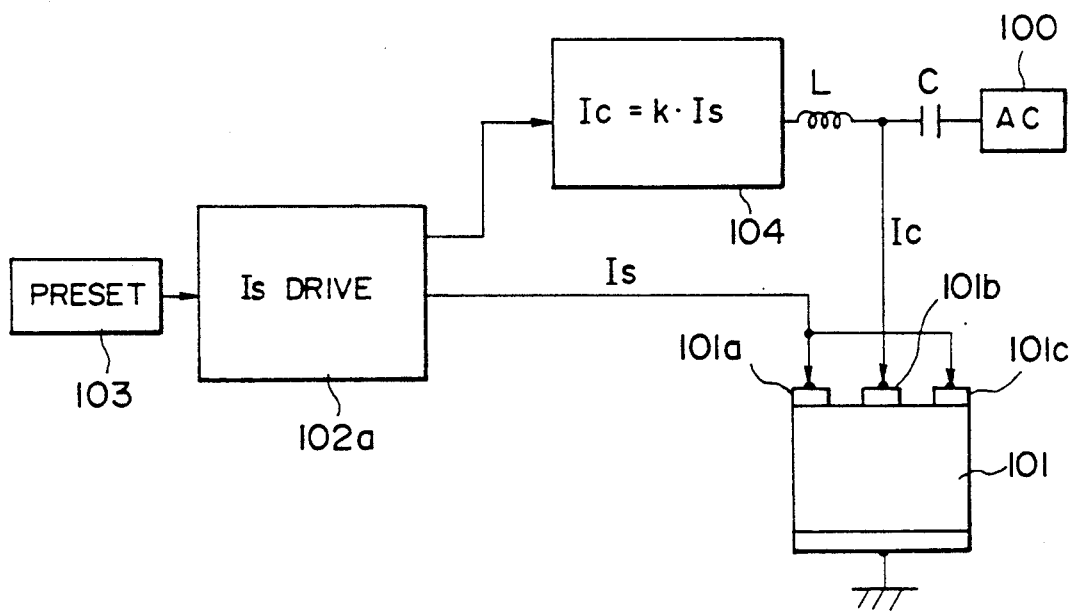
FIG. 11(A) is a block diagram of a third embodiment of the driver circuit according to the present invention.

FIG. 11(A) shows a third embodiment of the present invention, wherein a driver circuit 104 is connected in series with a driver circuit 102a to produce the drive current Ic. The driver circuit 102a produces the drive current Is and, further supplies the same to the electrodes 101a and 101c of the laser diode 101. The drive current Ic is supplied to the electrode 101b via a choke coil L together with the modulation signal that is produced by the A.C. voltage source 100 and superposed on the drive current Ic via the capacitor C. In accordance with this circuit, the driver circuit 102' is not used.

Figure 11B:
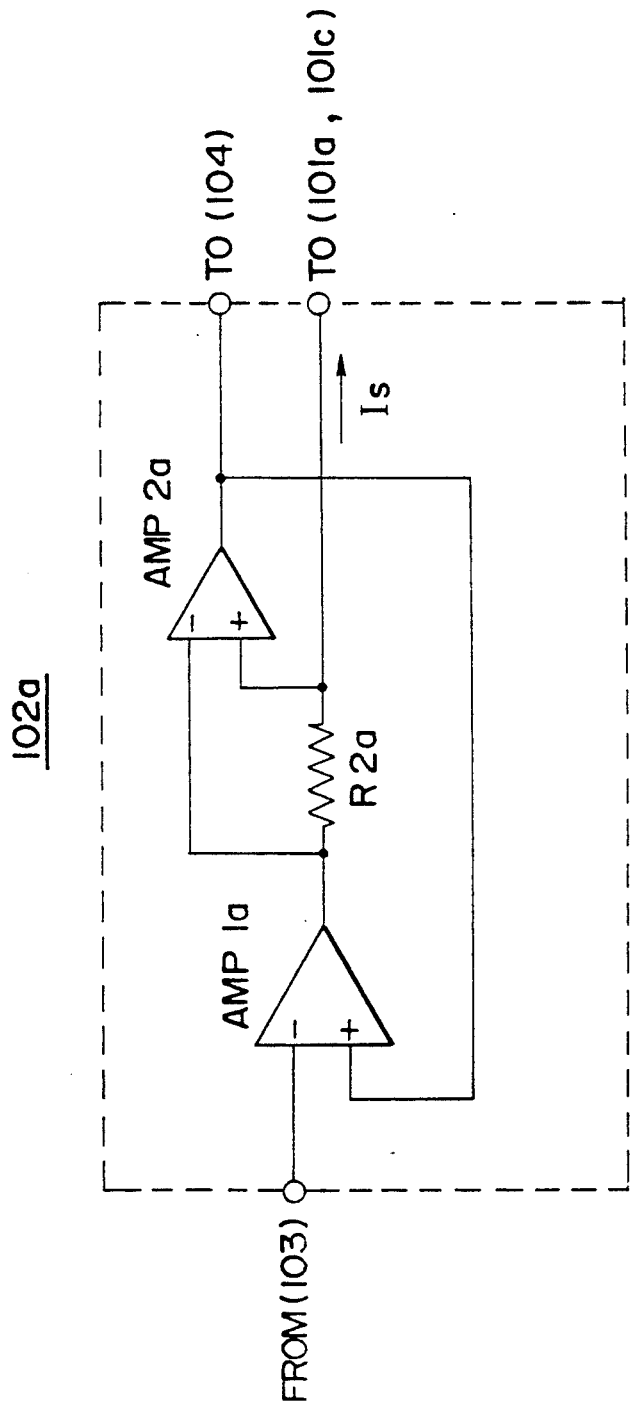
FIGS. 11(B) and 11(C) are circuit diagrams corresponding to parts of the block diagram of FIG. 11(A)

FIG. 11(B) shows the construction of the driver circuit 102a.

Referring to FIG. 11(B), the circuit 102a includes a differential amplifier AMP1a and another differential amplifier AMP2a, wherein the amplifier AMP1a has an inverting input terminal to which the output voltage of the preset controller 103 is supplied. The output of the amplifier AMP1a is supplied to an output terminal of the circuit 102a via a resistor R2a, and the voltage drop caused across the resistor R2a is detected by the differential amplifier AMP2a. Further, the output of the amplifier AMP2a, proportional in magnitude to the current Is flowing through the resistor R2a, is supplied to a non-inverting input terminal of the amplifier AMP1a. The differential amplifier AMP2a provides a feedback control path similar to the embodiment of FIG. 8 and maintains the level of the current Is substantially constant.

Figure 11C:
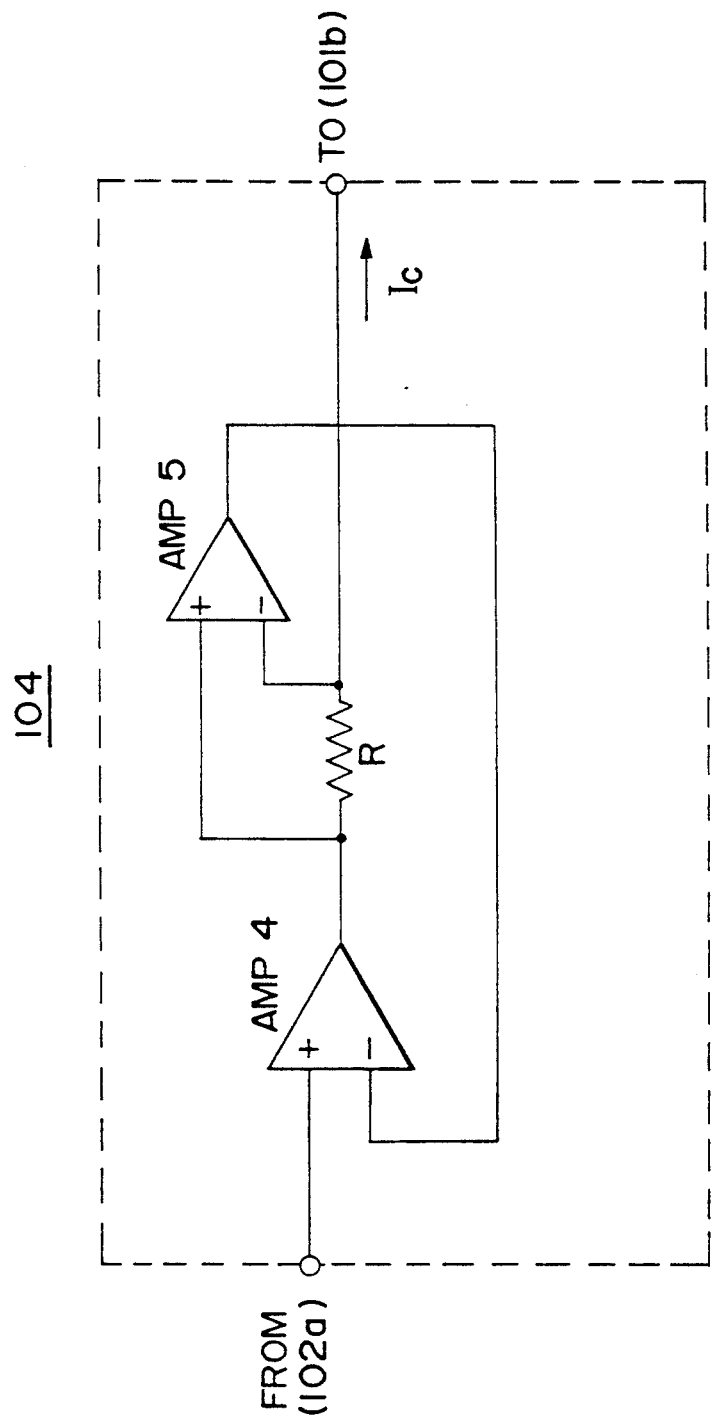

FIG. 11(C) shows the construction of the driver circuit 104.

Referring to the drawing, the circuit 104 has a construction similar to the circuit 102a and includes a differential amplifier AMP4, a resistor R and another differential amplifier AMP5. There, the output of the differential amplifier AMP2a of the driver circuit 102a is supplied to an non-inverting input terminal of the amplifier AMP4 and the amplifier AMP4 produces the output drive current Ic via a resistor R. The voltage drop caused across the resistor R is then detected by the amplifier AMP5 that in turn produces an output voltage in proportion to the magnitude of the current Ic. The output of the amplifier AMP5 is then fed back to the inverting input terminal of the amplifier AMP4. Thereby, the circuit 104 produces the output drive current Ic and maintains the magnitude thereof substantially constant.

In this embodiment, too, the drive current Ic and the drive current Is are produced with the relative magnitude proportional with each other as $$Ic = k \cdot Is$$

wherein the proportional constant k is determined by the magnitude of the resistance R2a. By suitably choosing the proportional constant k, one can operate the laser diode along the line M or line N.

Figure 12:
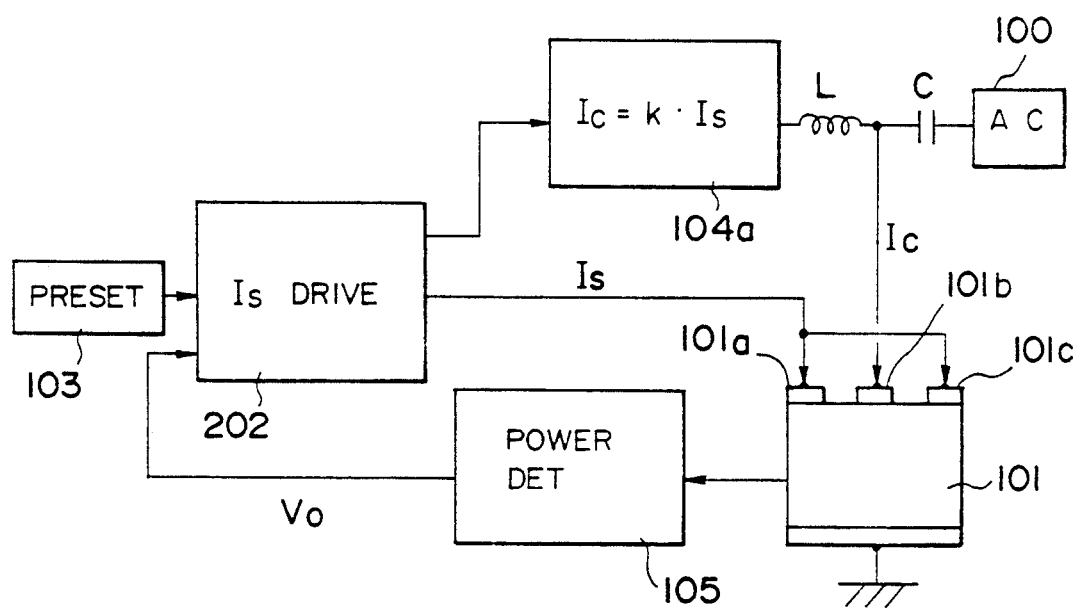
FIG. 12(A) is a block diagram of a fourth embodiment of the driver circuit according to the present invention.
FIG. 12(B) is a circuit diagram corresponding to a part of the block diagram of FIG. 12(A)
FIG. 12C is a circuit diagram of another part of the block diagram of FIG. 12A.

FIG. 12(A) shows a fourth embodiment of the present invention, wherein the optical detector 105 is used in combination with the circuit of FIG. 11(A). In the circuit of FIG. 12(A), a driver circuit 202 is used in place of the driver circuit 102a for producing the drive current Is. Further, a driver circuit 104a is used in place of the driver circuit 104 for producing the drive current Ic. The modulation signal is produced by the A.C. source 100 and superposed on the drive current Ic outputted from the driver circuit 104 via the choke coil L.

Figure 12B:
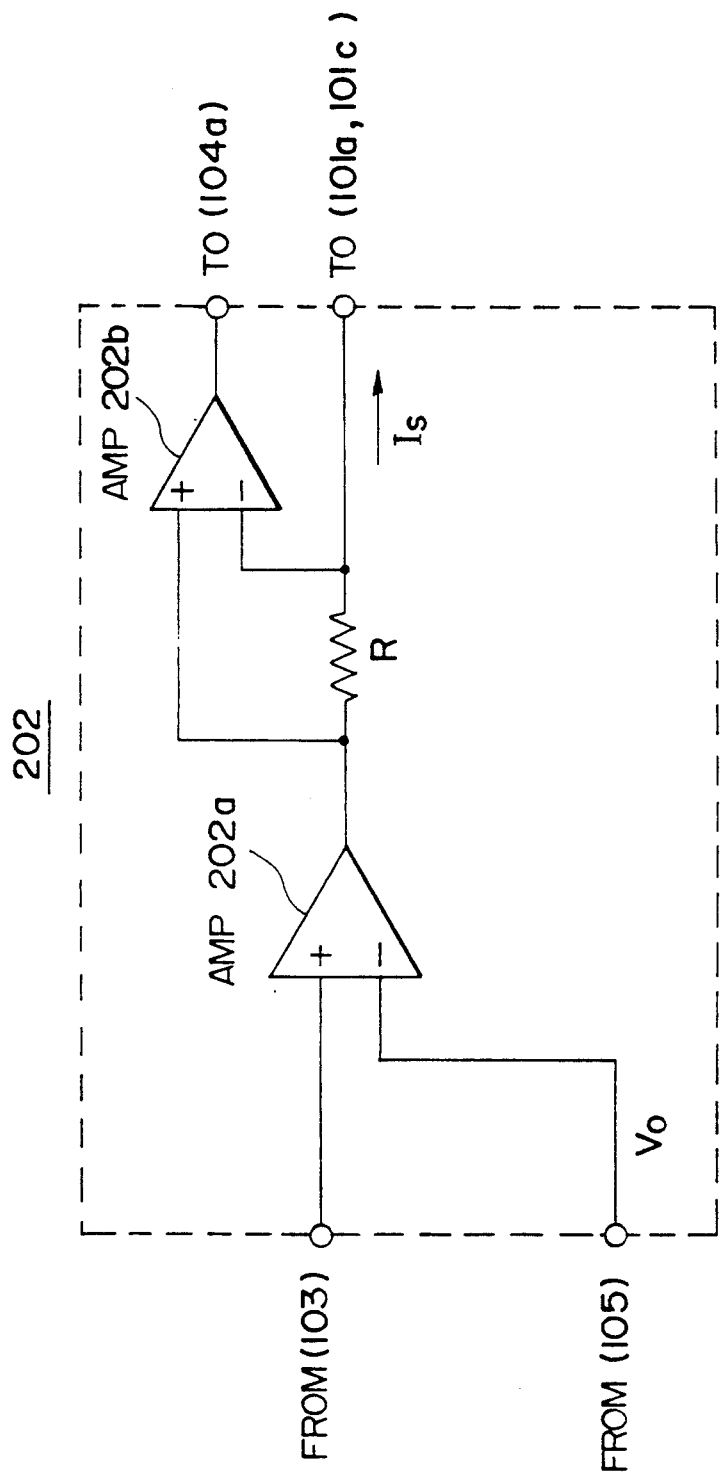

Referring to FIG. 12(B), the driver circuit 202 includes an amplifier AMP202a that is supplied on the one hand with the output of the controller 103 at the non-inverting input terminal thereof and on the other hand with the output voltage Vo of the optical detector 105 at the inverting input terminal thereof. The amplifier AMP202a produces an output current via a resistor R as the drive current Is, and the magnitude of the current Is is detected by an amplifier AMP202b that produces an output proportional to the drive current Is. This output of the amplifier AMP202b is supplied to the driver circuit 104a.

Figure 12C:
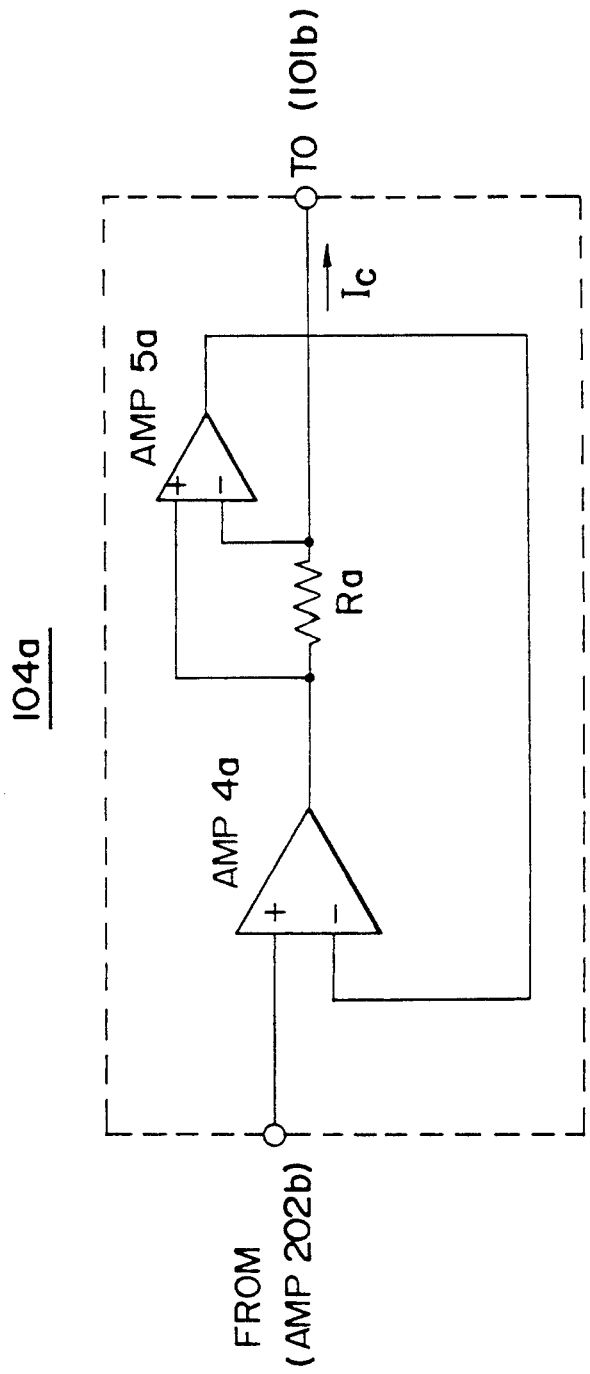

FIG. 12(C) shows the driver circuit 104a. There, the output of the amplifier 202b of the circuit 202 is supplied to the non-inverting input terminal of a differential amplifier AMP4a that produces the output drive current Ic in response thereto. The output current Ic is caused to flow through a resistor Ra wherein the voltage drop caused across the resistor Ra is detected by a differential amplifier AMP5a. The output of the differential amplifier AMP5a is proportional to the magnitude of the output current Ic and is fed back to the inverting input terminal of the amplifier AMP4a, wherein the amplifier AMP4a stabilizes the magnitude of the current Ic by reducing the difference in the voltage across the two input terminals. In this embodiment, too, the current Ic is produced with a predetermined ratio to the current Is, and the laser diode can be operated along the line M or N described previously.

Figure 13A:
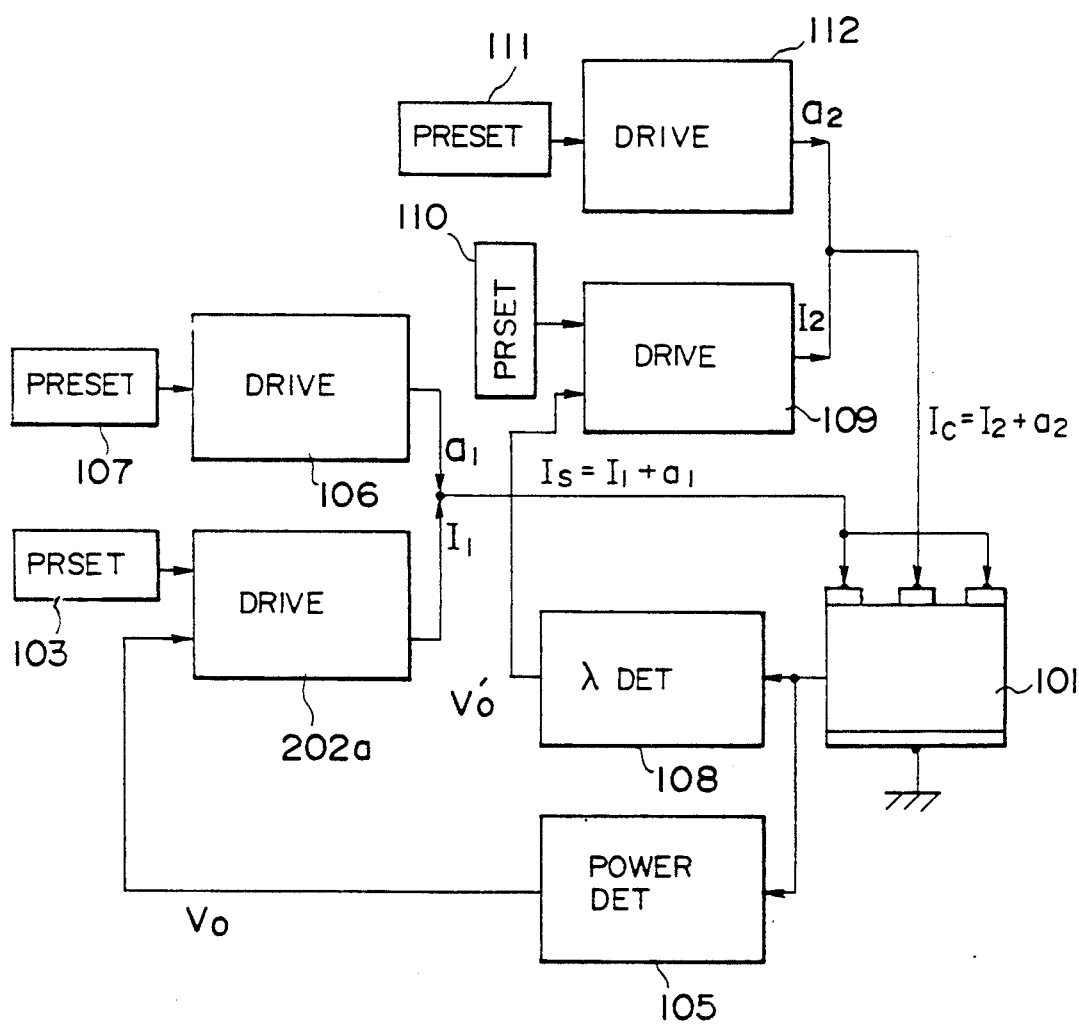
FIG. 13(A) is a block diagram showing a fifth embodiment of the driver circuit according to the present invention.
Figure 13B:
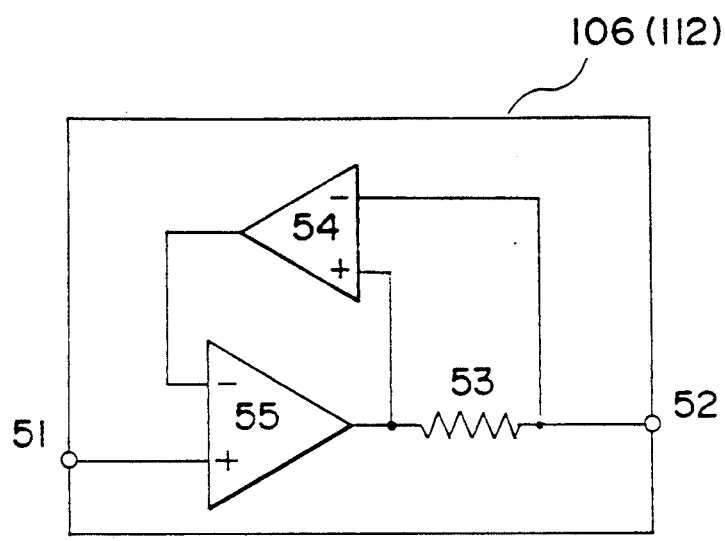
FIGS. 13(B) and 13(C) are circuit diagrams corresponding to parts of the circuit of FIG. 13(A)

FIG. 13(A) shows a fifth embodiment of the present invention and FIG. 13(B) shows a part of the circuit of FIG. 13(A). In this embodiment, the circuit 105 as well as circuits 106 and 202a are used to form the drive current to be supplied to the electrodes 101a and 101c of the laser diode 101, wherein the drive circuit 202a produces only a part of the drive current Is as will be described later. The construction of the circuit 106 and the circuit 202a will be described later with reference to FIGS. 13(B) and 13(C).

Referring to the FIG. 13(A), this embodiment uses a controller 110 similar to the controller 103, and a driver circuit 109 is used for producing a drive current $I_2$ that forms a part of the drive current Ic. The driver circuit 109 produces the current $I_2$ in response to the output voltage of the controller 110 and supplies the same to the electrode 101b of the laser diode 101. Further, the system of FIG. 13(A) includes a wavelength monitor 108 that monitors the oscillation wavelength of the laser diode 101 and produces a voltage signal Vo' indicative thereof. The construction of the monitor 108 will be described later.

The voltage signal Vo' of the monitor 108 is then supplied to the driver circuit 109 for controlling the current $I_2$ such that the oscillation wavelength of the laser diode 101 is held at a predetermined wavelength. The circuit 109 has a construction similar to that of the circuit 202a of FIG. 12(B) to be described later except that the voltage Vo' is supplied in place of the voltage Vo. Therefore, the illustration and description of the circuit 109 will be omitted.

The circuit of FIG. 13(A) further includes another controller 111 and a cooperating driver circuit 112, wherein the controller 111 corresponds to the controller 103 while the driver circuit 112 produces, in response to the preset output voltage of the controller 111, a drive current $a_2$ that forms a part of the current Ic together with the current $I_2$. It should be noted that the drive current Ic is now obtained as a sum of the current $a_2$ and $I_2$.

In addition, the system of FIG. 13(A) includes a controller 107 corresponding to the controller 103 and a driver circuit 106 that produces a drive current $a_1$ in response to the preset output voltage provided by the controller 107. The drive current $a_1$ produced by the driver circuit 106 is added to the drive current $I_1$ and forms the drive current Is. Similar to the embodiment of FIG. 12(A), the output power of the laser diode 101 is monitored by the optical detector 105 and the driver circuit 202 controls the current $I_1$ in response to the output voltage Vo such that the output optical power of the laser diode is held at a predetermined level.

Figure 13C:
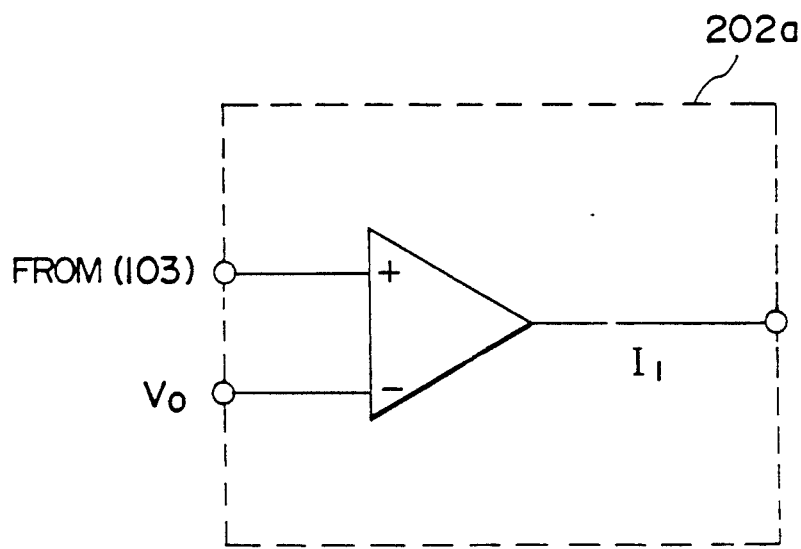

The construction of the circuit 106 is shown in FIG. 13(B) while FIG. 13(C) shows the construction of the circuit 202a. Referring to FIG. 13(B), the circuit 106 includes amplifiers 54 and 55 respectively corresponding to the amplifiers AMP5 and AMP4 of FIG. 11(C), together with a resistor 53 that corresponds to the resistor R of FIG. 11(C). There, the amplifier 55 produces a current output at an output terminal 52 in response to the voltage signal at the non-inverting input terminal 51 from the preset controller 107 while the amplifier 54 supplies its output voltage to the inverting input terminal of the amplifier 55 for controlling the same in response to the voltage drop formed across a resistance 53. Thereby, a stable output current is obtained at the output terminal 52 as the current $a_1$.

FIG. 13(C) shows the construction of the circuit 202a. As illustrated, the circuit 202a is formed from a simple differential amplifier that has a non-inverting input terminal to which the output voltage of the preset controller 103 is supplied and an inverting input terminal to which the voltage Vo of the optical detector 105 is supplied. The amplifier produces thereby an output current $I_1$ with the magnitude proportional to the voltage difference across the input terminals.

By using the circuit of FIG. 13(A), it will be noted that one can maintain the oscillation wavelength and the optical output power constant as desired. It should be noted that the relationship between the drive current Is and the drive current Ic is not limited to be the proportional one as in the previous embodiments but any combination may be possible by controlling the offset currents $a_1$ and $a_2$ by the preset controllers 107 and 111, respectively.

Figure 14:
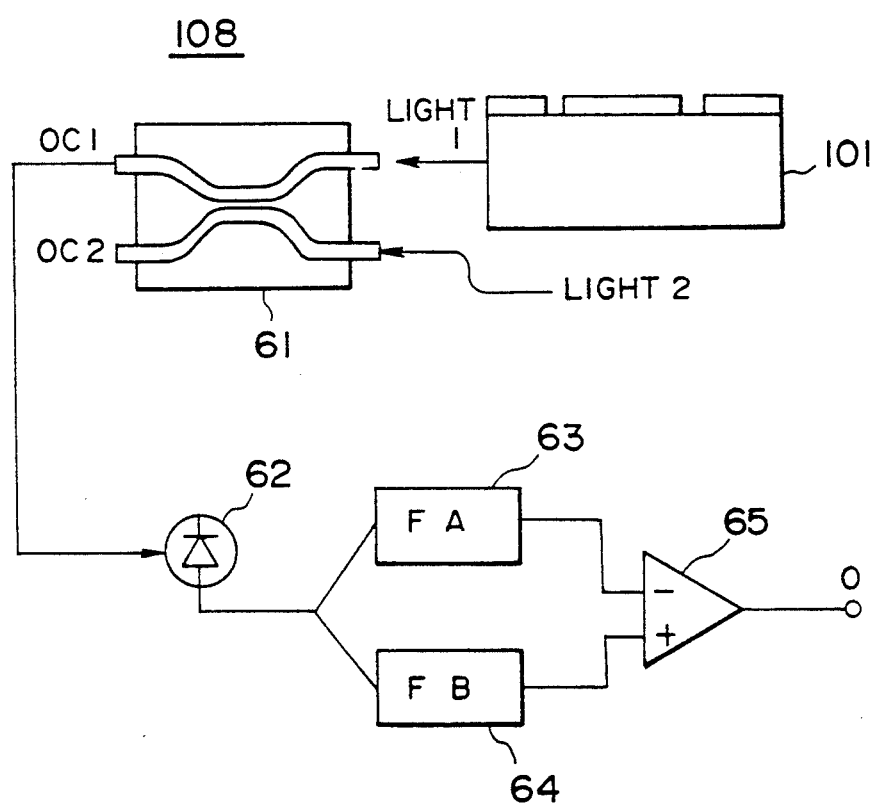
FIG. 14 is a circuit diagram showing a device used for wave length detection in the circuit of FIG. 13.

FIG. 14 shows the construction of the wavelength monitor 108.

Referring to FIG. 14, the monitor 108 includes a directional coupler 61 that in turn includes a pair of optical fibers OC1 and OC2, wherein the optical fibers are coupled each other optically and the output optical beam of the laser diode 101 is introduced into the first optical fiber OC1. Further, there is provided a stable 1.5 $\mu$m lasing line of He—Ne laser for producing a reference optical beam with the wavelength of 1.5 $\mu$m, as LIGHT 2. The output optical beam of the He—Ne laser is introduced into the optical fiber OC2 as the local reference beam (LIGHT 2) and causes an interference with the output optical beam that is produced by the laser diode 101 and introduced into the optical fiber OC1. As a result, an optical beam is formed in the optical fiber OC1 with the oscillation frequency corresponding to the difference between the frequency of the beam in the optical beam OC1 and the frequency of the beam in the optical beam OC2.

Figure 15:
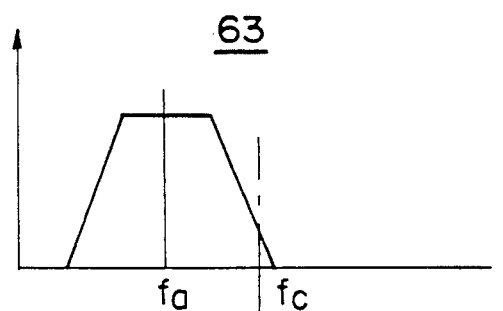
FIGS. 15(A)–15(C) are diagrams showing the characteristics of the band pass filters used in the circuit of FIG. 14.
Figure 15:
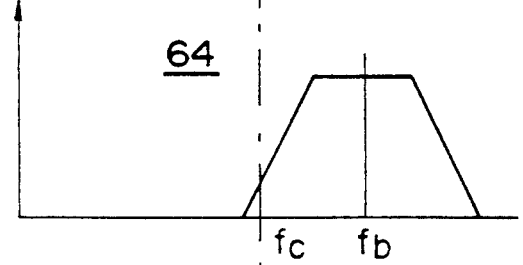
Figure 15:
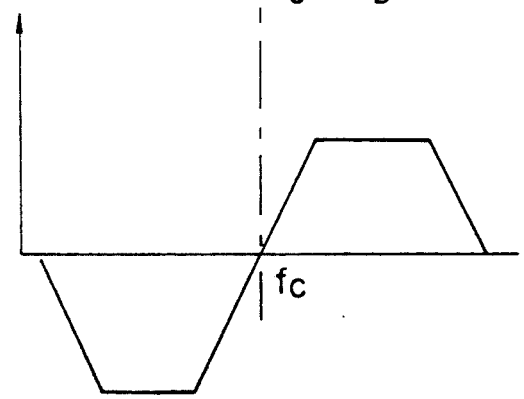

The optical beam thus formed as a result of interference is then detected by a photodiode 62 and the output of the photodiode is passed through first and second band pass filters 63 and 64 simultaneously, wherein the first filter 63 has a pass-band characteristic shown in FIG. 15(A) while the second filter 64 has a pass-band characteristic shown in FIG. 15(B). It should be noted that the first and second band-pass filters 63 and 64 have respective central frequencies fa and fb, wherein the frequency fa and the frequency fb are set to be symmetrical about a central frequency fc that coincides with the desired oscillation frequency of the laser diode 101. It should be noted that the characteristic curves for the filters 63 and 64 are generally analogous in shape and coincide, substantially, if shifted to a common central frequency.

The electric signal thus passed through the filter 63 is then supplied to the inverting input terminal of a differential amplifier 65 while the electric signal passed through the filter 64 is supplied to the non-inverting input terminal of the amplifier 65. Thereby, the characteristic curve for the filter 63 is inverted and an overall characteristic shown in FIG. 15(C) is obtained for the circuit as a whole.

In operation, the output voltage appearing at an output port O of the differential amplifier 65 increases in the positive direction when the oscillation frequency of the laser diode 101 increases. On the other hand, when the oscillation frequency decreases, the voltage appearing at the output port O changes in the negative direction. Thus, by detecting the voltage appearing at the output port O of the amplifier 65, one can monitor the deviation of the oscillation frequency and hence the oscillation wavelength of the laser diode 101. The central frequency fc may be set to 5 GHz, for example.

According to the present embodiment of FIG. 13A, the drive current Ic is controlled according to the relationship $$Ic = I + a_2$$

wherein the current $I_2$ is controlled by the driver circuit 109 while the current $a_2$ is set constant by the circuit 106. Similarly, one can control the drive current Is according to the relationship $$Is = I_1 + a_1$$

wherein the current $I_1$ is controlled by the drive circuit 202 and the current $a_1$ is set constant by the circuit 106. By controlling the currents $I_1$ and $I_2$ as such, one can operate the laser diode 101 at a constant optical output power and constant wavelength that in turn can be set as desired by the preset controllers 103, 107, 110 and 111. Thus, the circuit of the present embodiment is suitable for a stable local oscillator for optical heterodyne operation.

Figure 16:
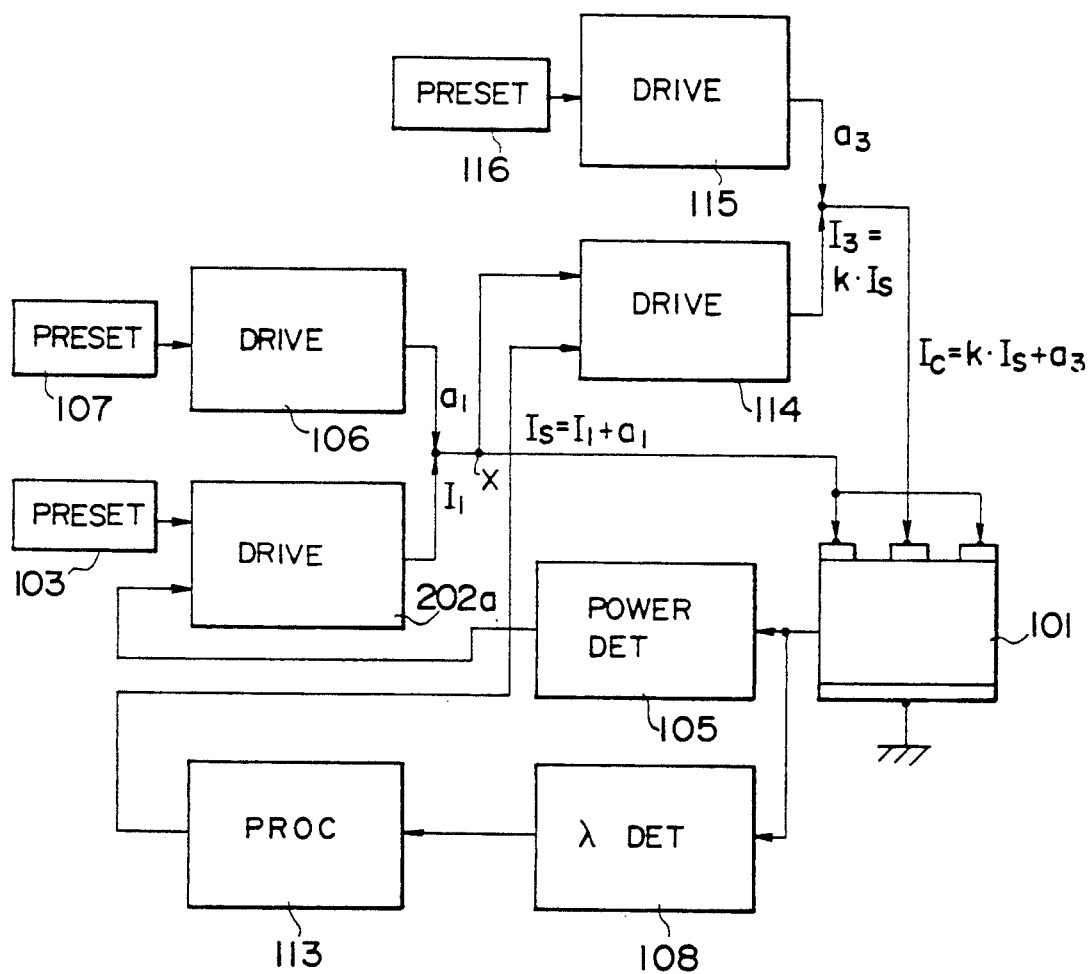
FIG. 16 is a block diagram showing a sixth embodiment of the driver circuit according to the present invention.

FIG. 16 shows a sixth embodiment of the present invention.

In this embodiment, the drive current Is is formed as a sum of the current $I_1$ that is produced by the driver circuit 202a and the current $a_1$ that is produced by the driver circuit 106. To this extent, the construction of the circuit of FIG. 16 is identical with the circuit of FIG. 13(A).

In addition, the circuit of FIG. 16 includes a current distribution circuit 114 that produces an output current $I_3$ based upon the input current Is according to the linear relationship $$I_3 = k \cdot Is.$$

Further, a preset controller 116 and a driver circuit 115 similar to the preset controller 111 and the driver circuit 112 of FIG. 13A are provided to add an offset current $a_3$ to the output of the circuit 114.

Figure 17A:
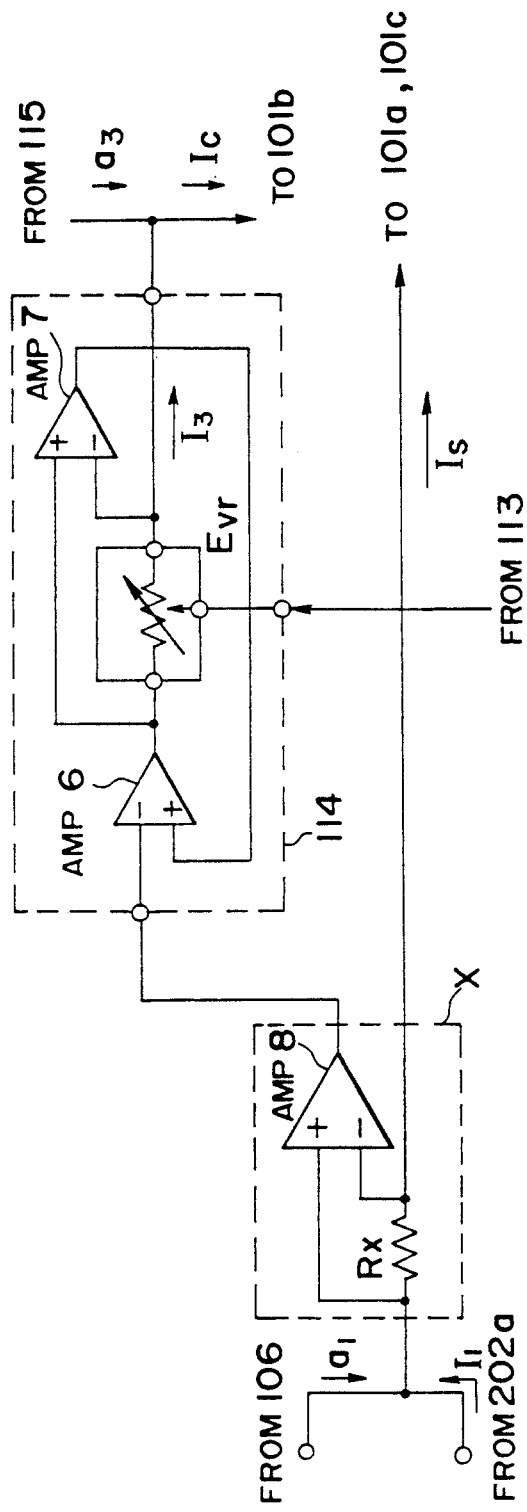
FIGS. 17(A) and 17(B) are circuit diagrams showing the details of the circuit of FIG. 16.

FIG. 17(A) shows the construction of the circuit 114.

Referring to FIG. 17(A), there is provided a resistor Rx and an amplifier AMP8 at a node X of FIG. 16, wherein the resistor Rx passes the current Is that is produced as a sum of the current $I_1$ and the current $a_1$ to the electrodes 101a and 101c of the laser diode 101, while the amplifier AMP8 is used to detect the magnitude of the current Is by detecting the voltage drop across the resistor Rx. The circuit 114 includes therein an amplifier AMP6, and the output of the amplifier AMP8 is supplied to the inverting input terminal of the amplifier AMP6.

The amplifier AMP6 produces the output current $I_3$ that is outputted via an electrically controlled variable resistor Evr. Further, there is provided another amplifier AMP7 that detects the voltage drop across the resistor Evr and controls the amplifier AMP6 by feeding the output voltage indicative of the voltage drop to the non-inverting input terminal of the amplifier AMP6. Thereby, a negative feedback control is applied to the operation of the amplifier AMP6. Further, the output of the wavelength monitor 108 is supplied to the variable resistor Evr via an output processing circuit 113 of the monitor 108 for controlling the resistance of the variable resistor Evr. It should be noted that the circuit 113 includes the filter circuits 63 and 64 as well as the amplifier 65 described with reference to FIG. 14. Thereby, a feedback control of the laser diode 101 is achieved based upon the oscillation wavelength.

Figure 17B:
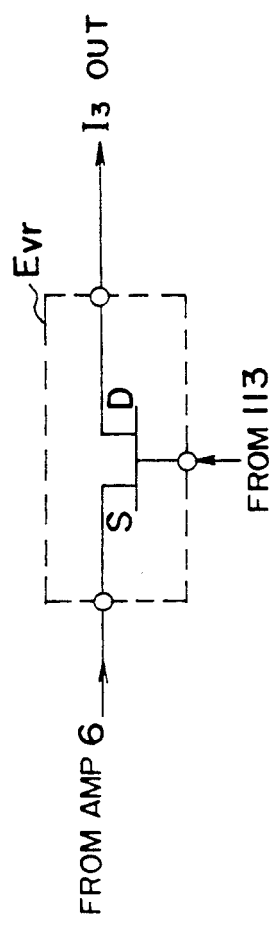

FIG. 17(B) shows an example of the variable resistor Evr, wherein the device is formed from a MOSFET supplied with the output of the amplifier AMP6 at the source S and producing the output current $I_3$ at the drain D. The output of the circuit 113 is supplied to the gate G and controls the magnitude of the current $I_3$ and hence the voltage drop across the source and the drain. However, the construction of the variable resistor is not limited to the one shown in FIG. 17(B).

Referring to FIG. 16 again, it will be noted that the circuit of the present embodiment provides the drive current Ic of $Ic = k \cdot Is + a_3$ while the drive current Is is given as $Is = I_1 + a_1$. By suitably choosing the parameter k and the offset $a_1$ and $a_3$, one can operate the laser diode at the selected output power and oscillation wavelength similar to the embodiment of FIG. 13(A). Thus, the laser diode of the present embodiment is suitable for the local oscillator or other stable optical source.

Further the present invention is not limited to the embodiments described heretofore, but various variations and modifications may be made without departing from the scope of the invention.

What is claimed is:

1. A driver circuit of a laser diode, said laser diode having a first electrode thereon for injecting therein a first drive current having a first magnitude and a second electrode thereon, separated from said first electrode for injecting therein a second drive current having a second magnitude, said second electrode means being provided on said laser diode in correspondence to portions thereof in which carriers are depleted the most, comprising:

presetting means for presetting a relationship between said first and second magnitudes;

current distribution means, controlled by said presetting means, for producing said first and second drive currents with respective magnitudes in accordance with the relationship preset by said presetting means;

first current control means, supplied with said first drive current from said current distribution means and comprising a first drive circuit and a first feedback loop, for maintaining a substantially constant magnitude of the first drive current; and second current control means, supplied with said second drive current from said current distribution means and comprising a second drive circuit and a second feedback loop, for maintaining a substantially constant magnitude of the second drive current.

2. A driver circuit as claimed in claim 1 in which said first magnitude of said first drive current is set to be generally proportional to said second magnitude of said second drive current by a predetermined factor, said presetting means presetting said predetermined factor.

3. A driver circuit as claimed in claim 1 in which said presetting means presets said relationship such that said second magnitude of said second drive current changes generally linearly with said first magnitude of said first drive current if said first magnitude of said first drive current is changed.

4. A driver circuit as claimed in claim 1 in which said presetting means produces a control signal indicative of said relationship, said current distribution means comprising voltage dividing means controlled in response to said control signal of presetting means for producing, in response to said control signal, a first control voltage indicative of the first magnitude of said first drive current and a second control voltage indicative of the second magnitude of said second drive current, first driver means for producing said first drive current of said first magnitude in response to said first control voltage, and second driver means for producing said second drive current of said second magnitude in response to said second control voltage, said second driver means receiving and superposing a modulation signal on said second drive current.

5. A driver circuit as claimed in claim 4 in which said first driver means includes a first amplifier for producing said first drive current and a first feedback controller for detecting said first drive current and for maintaining said first drive current at a constant level, said second driver means includes a second amplifier for producing said second drive current and a second feedback controller for detecting said second drive current and for maintaining said second drive current at a constant level.

6. A driver circuit as claimed in claim 1 in which said driver circuit further comprises optical detection means for detecting an output optical power of said laser diode, said optical detection means producing a detection signal indicative of the output optical power of said laser diode, and adjusting means, interposed between said presetting means and said current distribution means and supplied with said detection signal of said optical detection mean, for adjusting said current distribution means by performing a feedback operation such that the output optical power of said laser diode is held substantially constant.

7. A driver circuit as claimed in claim 1 in which said driver circuit further comprises frequency detection means for detecting an oscillation frequency of said laser diode, said frequency detection means producing a detection signal indicative of said oscillation frequency and controlling said current distribution means by performing a feedback operation such that the oscillation frequency of said laser diode is held substantially constant.

8. A driver circuit as claimed in claim 1 in which said presetting means comprises a first voltage source for producing a first control signal indicative of said first magnitude of said first drive current and a second voltage source for producing a second control signal indicative of said second magnitude of said second drive current, and, said current distribution means comprises first driver means supplied with said first control signal for producing said first drive current of said first magnitude in response to said first control signal, and second driver means supplied with said second control signal for producing said second drive current of said second magnitude in response to said second control signal.

9. A driver circuit as claimed in claim 8 in which said presetting means further comprises a third voltage source for producing a third control signal and a fourth voltage source for producing a fourth control signal, said current distribution means further comprises third driver means supplied with said third control signal for producing a third drive current, said third driver means superposing said third drive current on said first drive current, and fourth driver means supplied with said fourth control signal for producing a fourth drive current, said fourth driver means superposing said fourth drive current on said second drive current.

10. A driver circuit as claimed claim 1 in which said presetting means produces a control signal that presets said first magnitude of said first drive current, said current distribution means comprises first driver means controlled in response to said control signal produced by said presetting means for producing said first drive current of said first magnitude at an output port and second driver means connected to said output port of said first driver means for detecting said magnitude of said first drive current and for producing said second drive current such that said second magnitude of said second drive current changes substantially proportional with changes of said first magnitude of said first drive current.

11. A driver circuit as claimed in claim 10 in which said presetting means comprises a first voltage source that produces a first voltage, a second voltage source that produces a second voltage and a third voltage source that produces a third voltage, said first driver means being supplied with said first voltage for producing said first drive current in response thereto, said current distribution means further comprising third driver means supplied with said second voltage for producing a third drive current, said third driver means superposing said third drive current on said first drive current, and fourth driver means supplied with said third voltage for producing a fourth drive current, said fourth driver means superposing said fourth drive current on said second drive current.

* * * * *

UNITED STATES PATENT AND TRADEMARK OFFICE
CERTIFICATE OF CORRECTION

PATENT NO. : 5,255,276
DATED : Oct. 19, 1993
INVENTOR(S) : TABUCHI et al.

It is certified that error appears in the above-indentified patent and that said Letters Patent is hereby corrected as shown below:

TITLE PAGE: [57] ABSTRACT:

line 8, change "depleated" to --depleted--;
    line 13, change "magnitude" to --magnitudes--.

Col. 3,   line 20, after "injecting" insert --a--;
         line 22, change "hereby" to --thereby--.

Col. 4,   line 37, delete "of the".

Col. 5,   line 29, after "port" insert --33--;
         line 64, change "electrode" to --electrodes--.

Col. 6,   line 12, change "hen" to --when--.

Col. 7,   line 5, after "further" insert --,--.

Col. 12, line 36, after "of" insert --said--;
         line 67, change "mean" to --means--.

Col. 13, line 18, after "and" delete ",";
         line 21, delete ",".

UNITED STATES PATENT AND TRADEMARK OFFICE
CERTIFICATE OF CORRECTION

PATENT NO. : 5,255,276
DATED : Oct. 19, 1993
INVENTOR(S) : TABUCHI et al.

It is certified that error appears in the above-indentified patent and that said Letters Patent is hereby corrected as shown below:

Col. 14, line 12, before "magnitude" insert --first--.

Signed and Sealed this

Twenty-third Day of August, 1994

Attest:

BRUCE LEHMAN

*Attesting Officer*   *Commissioner of Patents and Trademarks*